United States Patent [19]
Peek

[11] Patent Number: 5,541,133
[45] Date of Patent: Jul. 30, 1996

[54] METHOD OF MANUFACTURING INSULATED ELECTRODES IN A SEMICONDUCTOR DEVICE AND SEMICONDUCTOR DEVICE MANUFACTURED BY SUCH A METHOD

[75] Inventor: Hermanus L. Peek, Eindhoven, Netherlands

[73] Assignee: U.S. Philips Corporation, New York, N.Y.

[21] Appl. No.: 336,147

[22] Filed: Nov. 8, 1994

[30] Foreign Application Priority Data

Nov. 10, 1993 [BE] Belgium ................................ 09301245

[51] Int. Cl.$^6$ .............................. H01L 21/70; H01L 27/00
[52] U.S. Cl. ................................................ 437/50; 437/53
[58] Field of Search ........................ 437/50, 53; 257/248, 257/249, 250, 251

[56] References Cited

U.S. PATENT DOCUMENTS

| | | | |
|---|---|---|---|
| 4,396,460 | 8/1983 | Tamaki et al. | 156/653 |
| 4,625,391 | 12/1986 | Sasaki | 148/DIG. 8 |
| 4,766,089 | 8/1988 | Davids et al. | 437/53 |

FOREIGN PATENT DOCUMENTS 0209425  5/1990  European Pat. Off. .

*Primary Examiner*—Mary Wilczewski
*Assistant Examiner*—Brian K. Dutton
*Attorney, Agent, or Firm*—Steven R. Biren

[57] ABSTRACT

Method of manufacturing a semiconductor device and semiconductor device manufactured by such a method.

A method of manufacturing a semiconductor device whereby a surface of a semiconductor body 1 is covered with an electrically insulating layer 8 and at least two electrical conductors 20, 23 are provided on the insulating layer next to one another and mutually separated by an interposed dielectric layer 21. The conductor 20 is formed from a first conductive layer deposited on the insulating layer. The upper surface and at least the flank 25 of the conductor 20 facing the other conductor are covered with the dielectric layer 21. Then a second conductive layer 22 is deposited over the entire surface which exhibits a step corresponding to the flank 25 of the first conductor. Subsequently, a mask 24 is formed which defines the second conductor, after which the second conductor 23 is formed from the second conductive layer through etching. According to the invention, the mask 24 is so aligned relative to the first conductor 20 that the edge of the mask facing towards the flank 25 is situated above the dielectric layer on the flank of the first conductor. The layer 22 is etched isotropically, which etching is continued so long after the second conductive layer 22 has been entirely removed from above the first conductor that said step in the second conductive layer has been removed at least partly owing to underetching below the mask. The invention may advantageously be used for the manufacture of a charge coupled device in which the electrodes do not overlap one another.

6 Claims, 2 Drawing Sheets

METHOD OF MANUFACTURING INSULATED ELECTRODES IN A SEMICONDUCTOR DEVICE AND SEMICONDUCTOR DEVICE MANUFACTURED BY SUCH A METHOD

BACKGROUND OF THE INVENTION

The invention relates to a method of manufacturing a semiconductor device whereby a surface of a semiconductor body is covered with an electrically insulating layer and at least two electrical conductors situated next to one another and mutually separated by an interposed dielectric layer are provided on the insulating layer, one of the conductors being formed from a first conductive layer deposited on the insulating layer, after which the upper surface and at least the flank of said one conductor facing towards the other conductor are covered with the dielectric layer, whereupon a second conductive layer is deposited over the entire surface, which second conductive layer exhibits a step corresponding to said flank of the first conductor, and subsequently a mask is formed which defines the second conductor and the second conductor is formed by means of etching from the second conductive layer which lies against the dielectric layer on the flank of the first conductor. The invention also relates to a semiconductor device manufactured by such a method.

The invention is of particular importance for charge coupled devices in which the electrical conductors form the gates or clock electrodes provided very closely together above the CCD channel, serving to control the charge storage and charge transport in the channel. The number of electrodes in this case is usually much greater than two. Besides in CCDs, the invention may also be advantageously applied in other types of semiconductor devices such as, for example, memories in which conductor tracks are present at very small distances from one another. It should accordingly be borne in mind that, although the invention will be explained below with particular reference to a charge coupled device, the use of the invention is not limited to charge coupled devices.

A usual practice in the manufacture of charge coupled devices is to provide the gates in a multilayer wiring in which the gates are provided in a higher wiring (or conductor) layer so as to extend in an overlapping manner to above the gates in a lower wiring layer. It is achieved thereby that the interspacings between the gates are no greater than the thickness of an oxide layer on the flanks of the gates in the lower wiring layer. A major disadvantage of this method is that the capacitances caused by this overlap are considerable and thus also the RC times of the electrodes, so that the transport speed is low. Moreover, the energy consumption or dissipation during operation is high owing to the high capacitance values. To counteract these disadvantages, it has been proposed to provide the gates in a non-overlapping configuration. Various methods are known for manufacturing such a configuration, but they all have the disadvantage that they are comparatively intricate. Thus European Patent 0.209,425 describes a method whereby the second wiring layer is provided so as to overlap the gates in the first wiring layer. Windows are then formed in the second wiring layer above the lower gates, after which the oxide layer covering the upper surface of the lower gates is removed through these windows. Subsequently the second wiring layer is subjected to an isotropic etching step for forming the gates in the second wiring layer, during which this layer is removed through half its thickness simultaneously with the gates in the lower wiring layer. The overlapping portions of the upper wiring layer are etched at two sides and removed throughout their entire thickness.

SUMMARY OF THE INVENTION

The invention has for its object inter alia to provide a method whereby gates can be provided at very short distances from one another without overlaps in a simple manner requiring no additional process steps. According to the invention, a method of the kind described in the opening paragraph is for this purpose characterized in that the mask is so aligned relative to the first conductor that the edge of the mask facing the flank is situated above or at least substantially above the dielectric layer on the flank of the first conductor, and in that the etching takes place isotropically and is continued so long after the second conductive layer has been entirely removed from above the first conductor that said step in the second conductive layer has at least been partly removed owing to underetching below the mask.

As will be explained with reference to the Figures below, the underetching effect below the mask may be utilized due to the fact that the upper wiring layer at the area of the step covering is etched mainly in vertical the direction. Owing to the comparatively great thickness of the upper conductive layer at the area of the step covering, it is possible to etch the second wiring layer on the step while avoiding the risk of undesirable openings being created between the gates owing to excessive etching.

An important embodiment of a method according to the invention is characterized in that the second conductive layer is provided to a thickness which is of the same order of magnitude as the alignment tolerance with which the mask is provided.

BRIEF DESCRIPTION OF THE DRAWING

The invention will be explained in more detail with reference to an embodiment and the accompanying diagrammatic drawing, in which.

DESCRIPTION OF THE PREFERRED EMBODIMENTS

Figure 1:
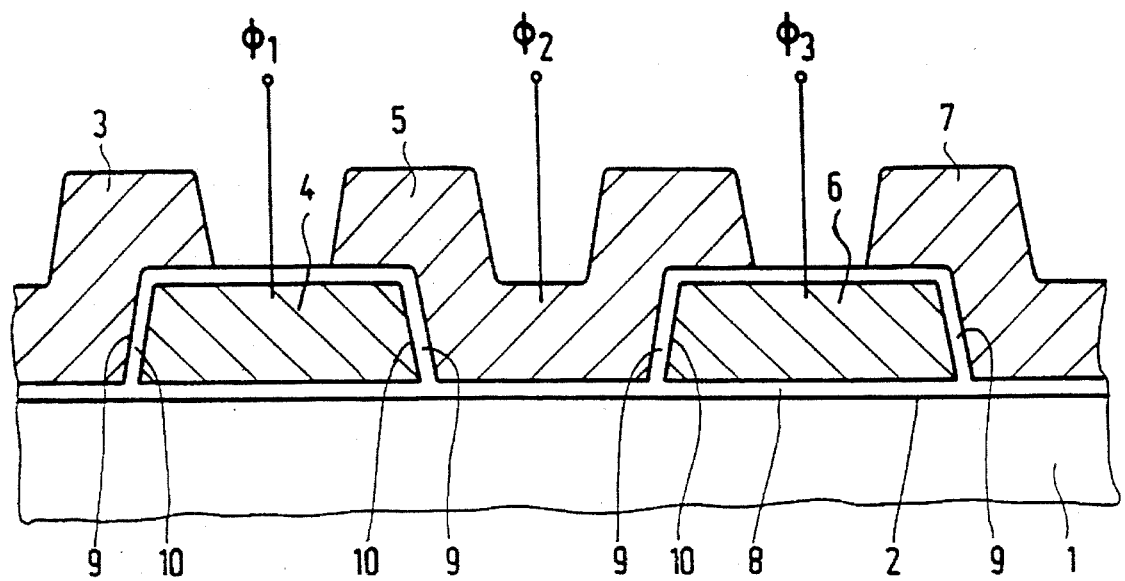
FIG. 1 is a cross-section of a CCD with a conventional electrode configuration.

It is noted that the drawing is diagrammatic and not true to scale.

FIG. 1 is a cross-section of a charge coupled device manufactured by a conventional method. The device comprises a semiconductor body 1, for example made of silicon, with a surface 2. A charge transport channel is defined in usual manner at or near this surface. The charge storage and transport are controlled by clock voltages $\phi_1$, $\phi_2$, etc., which are applied to gates or clock electrodes. Only five of these, i.e. the electrodes 3–7, are shown in the drawing, but in actual fact the number will obviously be much higher in most cases. The electrodes are insulated from the surface 2 by the gate dielectric 8, for example, an oxide layer and/or a silicon nitride layer.

It is of great importance for a good operation of the device that the electrodes are situated very closely together, i.e. with interspacings smaller than the minimum dimensions which can be achieved with the conventional equipment. For this purpose, the electrodes are usually provided in a multilayer wiring. FIG. 1 shows an embodiment by way of example with two conductive layers separated by an electrically insulating layer, where the electrodes 4 and 6 are formed in a first conductive layer of polycrystalline silicon, referred to as poly hereinafter, or of a suitable metal, and the electrodes 3, 5 and 7 are formed in a second poly or metal layer. The distances between the electrodes are determined by the thickness of the oxide layer 9 which covers the flanks 10 of the electrodes 4 and 6. A specific value for the oxide thickness is, for example, 0.2 μm. As is shown in the drawing, the electrodes 3, 5, 7 overlap the electrodes 4, 6, etc., whereby critical alignment steps are avoided. This overlap causes a great capacitance between the electrodes, and thus an increase in the energy consumption. In addition, the overlapping electrode configuration described here results in a strongly profiled, i.e. non-flat surface, which is often detrimental in subsequent process steps.

Figure 2:
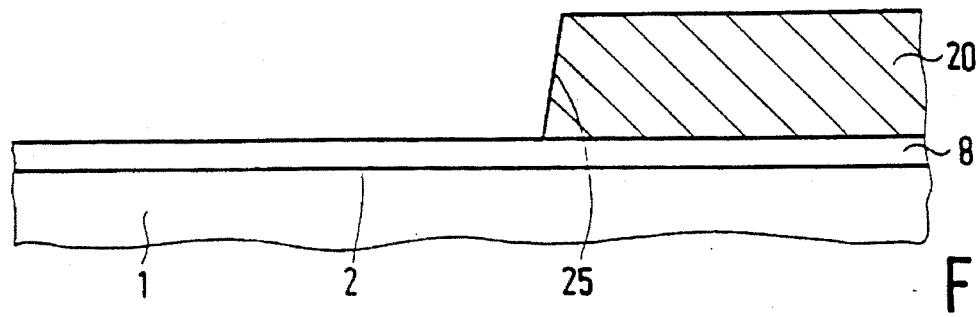
FIGS. 2–4 are cross-sections of a device in a number of stages of manufacture by a method according to the invention.
Figure 3:
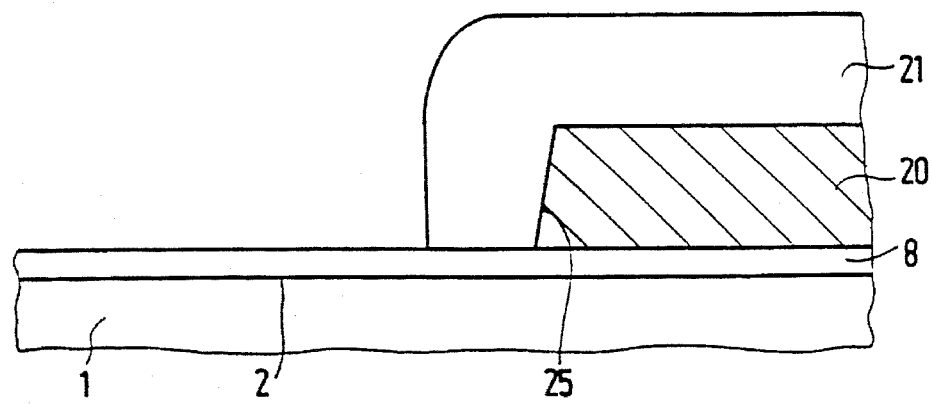
Figure 4:
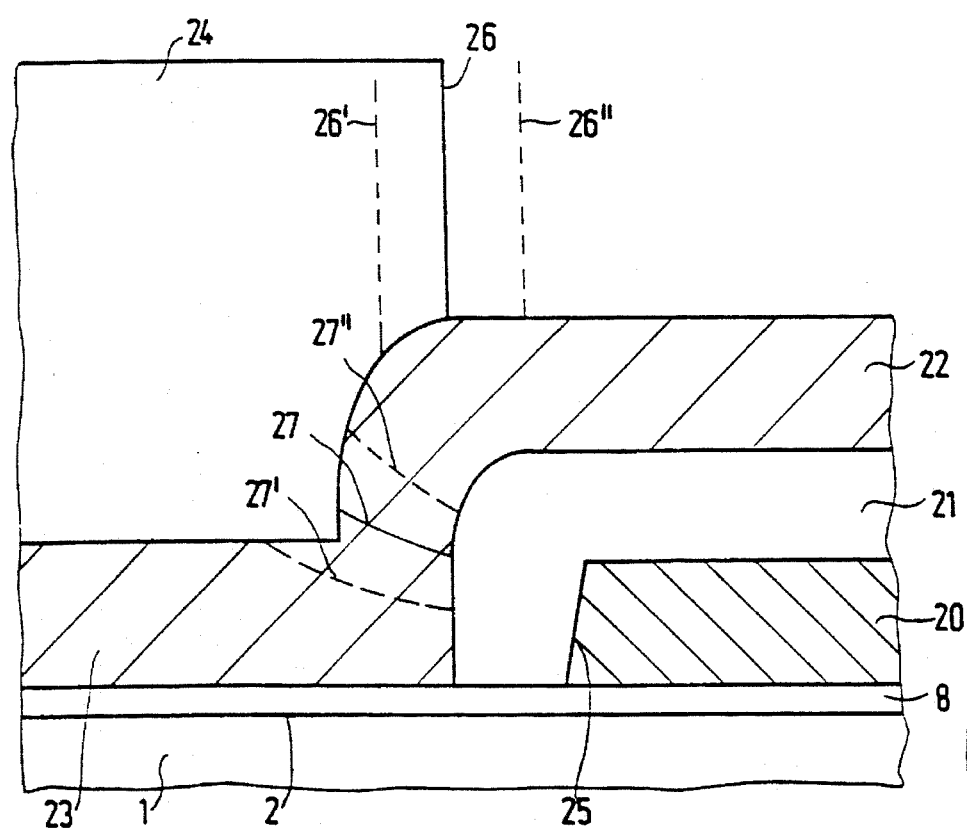

FIGS. 2–4 show a portion of a device manufactured by a method according to the invention, with two electrodes situated next to one another. The method again starts with a semiconductor body 1 whose surface 2 is covered with a gate dielectric 8 comprising a dual layer of silicon oxide and silicon nitride. After deposition of poly to a thickness of, for example, approximately 0.5 μm, the electrode 20 is formed in usual manner by photomasking and etching. Obviously, not only the electrode drawn but also other electrodes are formed from this poly layer in the case of a CCD. In a next step (FIG. 3), an electrically insulating layer 21 is provided, in this example an oxide layer with a thickness of approximately 0.2 μm obtained through thermal oxidation. Then the second poly layer 22, see FIG. 4, is provided to a thickness of approximately 0.4 μm. The electrode 23 situated next to the electrode 20 is defined by the photomask 24 which is formed on the poly layer 22.

In contrast to conventional methods, in which the mask amply overlaps the electrode 20, according to the invention the mask is aligned relative to the flank 25 of the electrode 20, so that the edge 26 of the photomask is situated substantially above the oxide layer 21 between the flank 25 and the step in the poly layer 22, so that there is no or at least substantially no overlap between the mask 24 and the electrode 20. Preferably, the mask 24 is so provided that the edge 26 coincides substantially with the flank of the oxide layer 21. FIG. 4 shows the ideal alignment of the mask 24 in full lines.

The poly layer 22 is then etched isotropically, for example, in a plasma of a mixture of $CF_4$ and $O_2$, whereby the exposed portion of the poly layer 22 above the electrode 20 is removed. The moment the oxide layer 21 is reached, i.e. all poly above the electrode 20 has been removed, etching is not yet stopped but is continued so that also the poly material in the step below the photomask 24 is removed. In a specific embodiment, the degree of overetching is approximately 40%. This overetching is possible without the formation of an opening between the oxide layer 21 and the electrode 23 due to the step in the poly layer 22 where the material is mainly removed in vertical direction during etching. The poly is removed up to the line 27 in the case of 40% overetching as indicated above. As is evident from the drawing, the layer may yet be etched further without disadvantages if this should be desirable, for example, for decreasing the capacitance along the flank 25.

A designer of integrated circuits should always allow for alignment errors whereby the edge 26 of the mask has in reality been shifted slightly to the left or right. FIG. 4 shows the edge of the mask 24 with broken lines 26', 26" for both situations, in which an alignment tolerance of approximately 0.4 μm (i.e. 0.2 μm in either direction) is assumed, which is readily achievable with modern alignment equipment. Owing to overetching, the poly 22 is entirely removed from above the electrode 20 also when the mask is shifted too far to the right, and thus may even overlap the electrode 20 slightly, so that nevertheless there will be no overlap between the electrodes 20 and 23. The boundary 27 of electrode 23 then shifts to 27" in the case of approximately 40% overetching. If the mask 24 is approximately 0.2 μm too far to the left, so that the edge 26 is at 26', the boundary 27 shifts to 27'. Owing to the step in the poly, etching takes place mainly in the vertical direction in this situation, the step being sufficiently high for preventing the poly from being removed throughout its entire thickness in the step.

Figure 5:
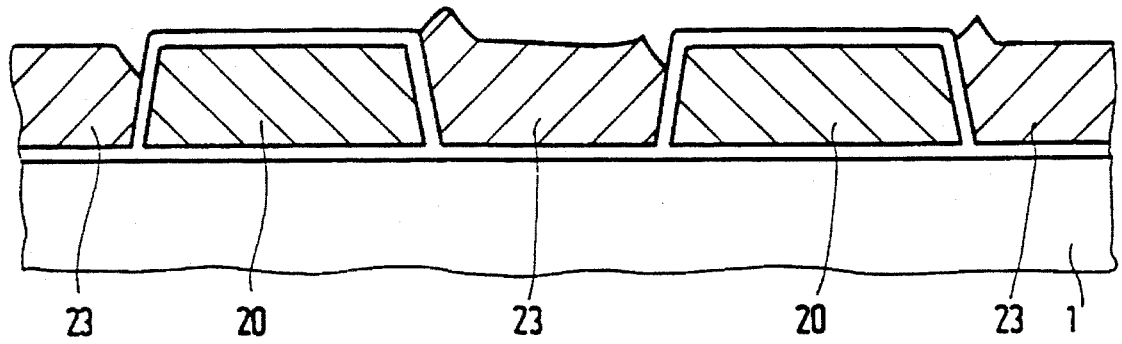
FIG. 5 is a cross-section of a charge coupled device manufactured by a method according to the invention.

FIG. 5 is a cross-section of a charge coupled device after the etching step described above, in which the mask 24 used for defining the electrodes 23 was shifted slightly to the left in comparison with the design. The electrodes formed in the first poly layer have been given the reference numeral 20 (which does not mean that they necessarily belong to a same phase of the CCD). The electrodes 23 are the electrodes in the second poly layer. These electrodes do not overlap the electrodes 20, so that the parasitic capacitances are small. Moreover, the structure is much planer than the structure in FIG. 1 with overlapping electrodes, which is advantageous for further operational steps such as, for example, the provision of contacts, color filters, etc. The device is manufactured in a simple manner which requires no additional process steps compared with conventional processes.

It will be apparent that the invention is not limited to the embodiment described here, but that many more variations are possible to those skilled in the art within the scope of the invention. Thus alternative materials may be used for the electrodes instead of poly, such as a suitable metal. The insulating layer 21 covering the electrodes 20 may comprise a nitride layer in addition to or instead of oxide. In addition to CCDs, the invention may advantageously used in other types of semiconductor devices.

I claim:

1. A method of manufacturing a semiconductor device comprising the steps of covering a surface of a semiconductor body with an electrically insulating layer and providing at least first and second electrical conductors situated next to one another and mutually separated by an interposed dielectric layer on the insulating layer, forming the first electrical conductor from a first conductive layer deposited on the insulating layer, then covering an upper surface and at least a flank of said first electrical conductor facing towards the second electrical conductor with the dielectric layer, depositing a second conductive layer over an entire surface of the device, said second conductive layer exhibiting a step corresponding in location to the location of said flank of the first electrical conductor, and subsequently forming a mask which defines the second electrical conductor and forming the second electrical conductor by etching a portion of the second conductive layer which lies against the dielectric layer on the flank of the first electrical conductor, aligning the mask relative to the first electrical conductor such that a vertical edge of the mask facing the flank of the first electrical conductor is situated at least substantially above the dielectric layer on the flank of the first conductor, and etching isotropically and for a length of time after the second conductive layer has been entirely removed from above the first electrical conductor such that said step in the second conductive layer has at least partly been removed due to underetching below the mask.

2. The method as claimed in claim 1, characterized in that the second conductive layer is provided to a thickness which is of the same order of magnitude as an alignment tolerance with which the mask is provided.

3. The method as claimed in claim 1, characterized in that the first and second electrical conductors form clock electrodes of a charge coupled device.

4. The method as claimed in claim 1, characterized in that the first conductive layer is provided as a silicon layer, and the dielectric layer is formed by oxidation of said silicon layer.

5. The method as claimed in claim 1, characterized in that etching of the second conductive layer is continued until the step in the second conductive layer has disappeared at least substantially.

6. A semiconductor device manufactured by a method as claimed in claim 1.

* * * * *